United States Patent [19]

Futsuhara et al.

[11] Patent Number: 5,105,124
[45] Date of Patent: Apr. 14, 1992

[54] LAMP FAILURE DETECTING DEVICE

[75] Inventors: Koichi Futsuhara; Masakazu Kato, both of Urawa, Japan

[73] Assignee: Nippon Signal Co., Ltd., Japan

[21] Appl. No.: 444,139

[22] PCT Filed: Mar. 25, 1988

[86] PCT No.: PCT/JP88/00307
§ 371 Date: Nov. 24, 1989
§ 102(e) Date: Nov. 24, 1989

[87] PCT Pub. No.: WO89/09533
PCT Pub. Date: Oct. 5, 1989

[51] Int. Cl.$^5$ ............................................. H01J 1/60
[52] U.S. Cl. ................................. 315/129; 315/134; 315/89
[58] Field of Search ............ 315/129, 134, 89, 88; 340/641

[56] References Cited

U.S. PATENT DOCUMENTS

| | | | |
|---|---|---|---|
| 3,417,310 | 12/1968 | Hill | 315/129 |
| 3,898,913 | 8/1975 | Kopernik | 315/129 |
| 3,964,040 | 6/1976 | Behl | 315/89 |
| 3,995,262 | 11/1976 | France | 318/129 |
| 4,376,910 | 3/1983 | Peslier | 315/134 |
| 4,527,095 | 7/1985 | Herring | 315/89 |

FOREIGN PATENT DOCUMENTS 852658 12/1972 U.S.S.R. .............................. 315/129

OTHER PUBLICATIONS

Disconnection Indicating Method, Toshio Kasahara, Document No. 62-16000, Japan, published Apr./10/87.

Primary Examiner—Eugene R. LaRoche
Assistant Examiner—A. Zarabian
Attorney, Agent, or Firm—Bruce L. Adams; Van C. Wilks

[57] ABSTRACT

A detecting device can centrally monitor and detect a lamp failure of one or more lamps connected in series such as guide lamps in the runway of an airfield. A core (12) is disposed on a power line ($P_1$) of each lamp ($L_1$-$L_n$). The power line ($P_1$) is wound on the core (12) as a first winding ($N_1$). A second winding ($N_2$) for extracting the power of the power line ($P_1$) is wound on the core (12). An oscillator (13) is provided which uses the output voltage of the second winding ($N_2$) as the power supply to generate a frequency corresponding to each lamp ($L_1$-$L_n$). The output signal from this oscillator (13) is fed back to the power line ($P_1$) through a third winding ($N_3$). Accordingly, a signal consisting of a frequency which represents each lamp flows through the lamp circuit and any failed lamp or lamps can be detected by checking this feedback signal.

12 Claims, 2 Drawing Sheets

LAMP FAILURE DETECTING DEVICE

TECHNICAL FIELD

This invention relates to a device for detecting the failure or disconnection of any of a plurality of electric lamps connected in series and has particular reference to such a device which is suitably used for detecting the failure of any of a large number of taxiway or guide lamps illuminating the runway of an airfield.

BACKGROUND ART

There are known certain devices designed to detect the failure in any one of guide lamps simply by the occurence of a breakage of the circuit to which such numerous lamps are connected in series. Such known devices have a drawback in that failure of one lamp results in extinction of all of the remaining lamps.

Improvements have been made in which a switch is provided, as illustrated in FIG. 6 of the accompanying drawings, to give a short circuit to the terminals of each of serially connected lamps so that failure of any one lamp does not affect all the other lamps. However, this circuit device has the disadvantage that it is difficult to know which of so many remotely located lamps has failed and therefore to monitor all the lamps centrally from one place.

With the foregoing difficulties of the prior art in view, the present invention seeks to provide a device for detecting lamp failure which is capable of performing accurate detection and remote central monitoring of a large number of electric lamps.

DISCLOSURE OF THE INVENTION

The above stated object of the invention is achieved by the provision of a lamp failure detecting device which essentially comprises a transformer for extracting power from a lamp power line, said transformer being operable in response to the existence of current flowing through a corresponding lamp, a signal generator operable by an output voltage of the transformer, and a means of superimposing an output signal from the signal generator onto the lamp power line as an induced current. The transformer comprises a core disposed on the lamp power line, the lamp power line is wound on the core as a first winding, and a second winding on the core for detecting the output of the first winding. The signal generator which may be structured to use a current extracted from the output voltage of the second winding, has an oscillator adapted to generate a frequency corresponding to a frequency specified for each of the serially connected lamps. An output signal having this frequency is fed back as an output current signal via a third winding and superimposed on the lamp power line. Thus, in the event of failure of any one lamp, this can be confirmed by detecting the existence of such feedback signal in that particular lamp circuit.

BEST MODE OF CARRYING OUT THE INVENTION

Figure 1:
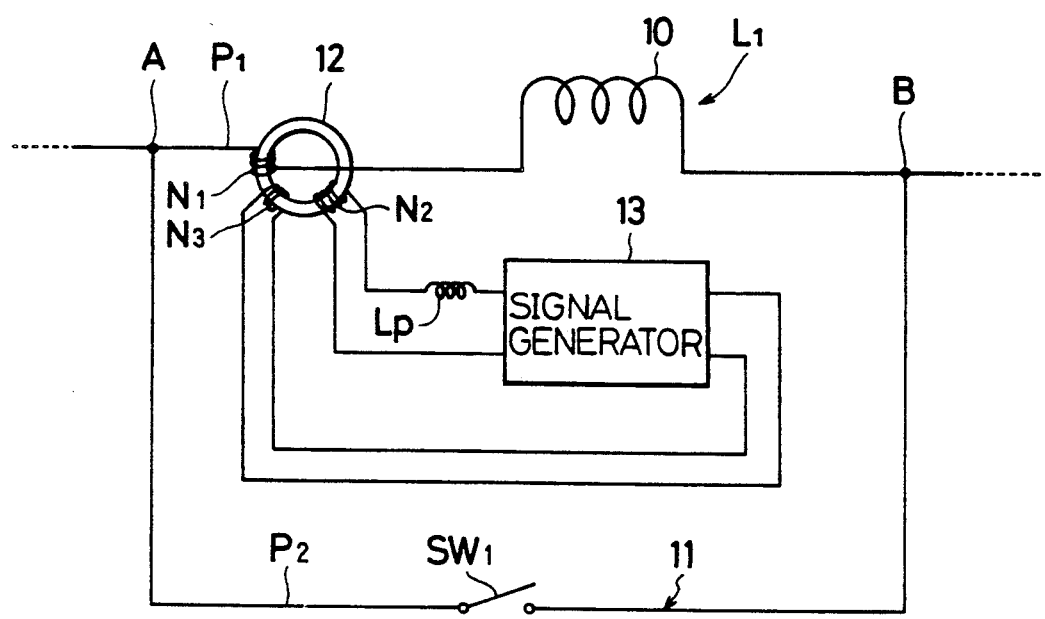
FIG. 1 is a schematic circuit diagram illustrating a lamp failure detecting device according to one embodiment of the invention.
Figure 2:
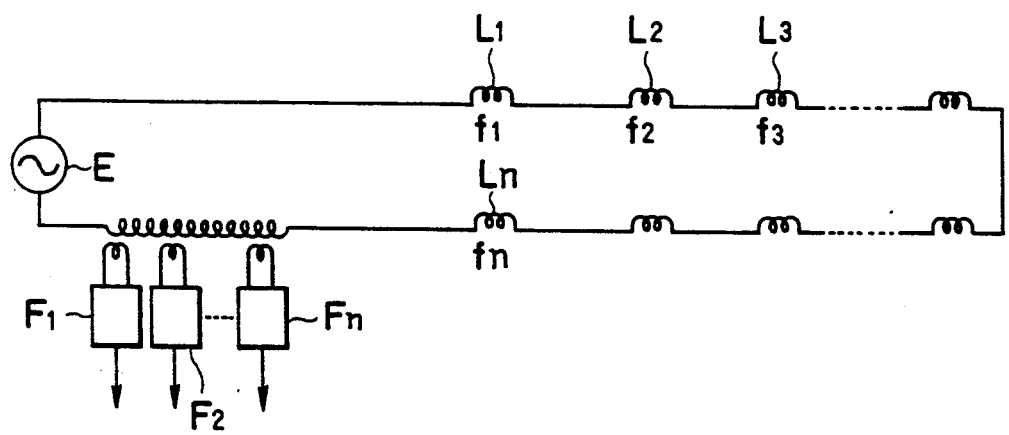
FIG. 2 is a schematic circuit diagram showing a plurality of lamps connected in series.

Referring now to the drawings and FIGS. 1 and 2 in particular, there is shown a lamp failure detecting device according to one embodiment of the invention for detecting the failure of any of a number of lamps $L_1$-$L_n$ connected in series (FIG. 2) which are powered by a supply source E having a commercial frequency. FIG. 1 is a circuit diagram on enlarged scale of a lamp $L_1$ having a filament 10. A short-circuitng circuit 11 is provided for giving a short circuit between the opposite terminals of the lamp filament 10. The circuit 11 is conventional, including a switch $SW_1$ which operates to close the circuit 11 in the event of lamp failure. The circuit 11 is connected to a power line $P_1$ at points A and B. A core 12 is provided on the power line $P_1$ between one terminal of the lamp filament 10 and the connection point A. The core 12 has wound thereon a first winding $N_1$, which is an extension of the power line $P_1$, a second winding $N_2$ for extracting power from the first winding $N_1$ via core 12 and a third winding $N_3$ for transferring a signal $S_1$ in superimposed relation to the first winding $N_1$ to provide the lamp $L_1$ with a signal of a predetermined frequency $f_1$.

The second winding $N_2$ functions as a means of detecting a current flow through the power line $P_1$ to turn on the lamp $L_1$.

A signal generator 13 is connected to the output terminal of the second winding $N_2$ and designed as an oscillator to be excited by the output voltage of the second winding $N_2$ to generate a specific frequency $f_1$. The output of the signal generator 13 is connected to the third winding $N_3$ to superimpose its output signal as a current through the core 12 on the power line $P_1$ so that the lamp $L_1$ is normally (i.e. when turned on) supplied with a signal of frequency $f_1$.

Designated at $L_p$ is an inductance adapted to prohibit entry of the feedback signal from the third winding $N_3$ into the signal generator 13 and allow passage of the frequency components of the lamp power current alone in the circuit.

The detecting device for the lamp $L_1$ is used commonly, as shown in FIG. 2, for each of the remaining lamps $L_1$-$L_n$ with their respective predetermined frequencies $f_2$-$f_n$ supplied in superimposed relation.

There are provided filters $F_1$-$F_n$ in the lamp power circuit assigned to corresponding lamps $L_1$-$L_n$ and adapted to extract their respective feedback signals; namely, feedback frequencies. Central monitoring of the lamp operation is effected by the circuit arrangement above described in which failure of the filament 10 in the lamp $L_1$ causes the switch $SW_1$ to close to permit current flow through the circuit 11, whereupon the current to the lamp $L_1$ and hence the signal $f_1$ from the signal generator 13 are discontinued and the frequency component $f_1$ in the lamp circuit can no longer be detected by the filter $F_1$ thereby ascertaining the occurrence of failure of the lamp $L_1$. The same applies to each of the remaining lamps.

Alternatively, lamp monitoring can also be effected with the core 12 provided on the short-circuiting line P₂, in which case the feedback signal does not flow through the lamp circuit as long as the lamp is on, but in the event of failure begins to flow with a frequency corresponding to that particular lamp which has failed and will be received by the corresponding one of the filters (F$_1$-F$_n$) thereby detecting the occurrence of failure of which particular one of the serially connected lamps.

Figure 3:
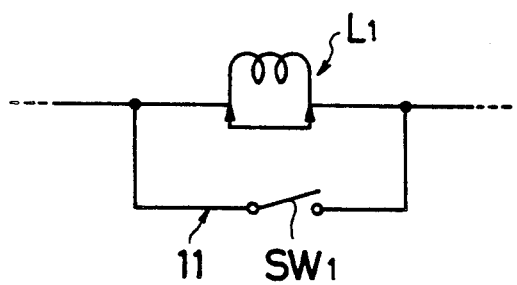
FIG. 3 schematically illustrates the terminals being short-circuited upon failure of a lamp filament.
Figure 4:
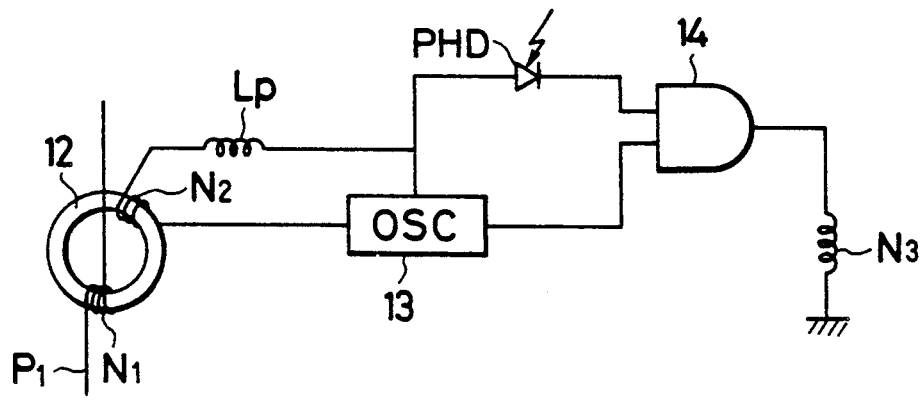
FIG. 4 is a schematic circuit diagram illustrating a lamp failure detecting device according to another embodiment of the invention and associated with a central monitoring arrangement.

Another embodiment of the invention is illustrated in FIG. 4, in which the filament 10 is broken (FIG. 3) with the current continues to flow through the power line P$_1$ and the signal generator 13 produces a feedback signal of frequency f$_1$. The circuit arrangement shown in FIG. 4 incorporates a photodiode PHD adjacent to the lamp. In the event of welding of the lamp L$_1$, in which case the filament no longer produces light but current continues to flow through the lamp, no light and hence no current flows through the photodiode PHD therefore there is no output at an AND-circuit 14 and hence no feedback signal received at the filter F$_1$, indicating that the lamp L$_1$ has welded.

Figure 5:
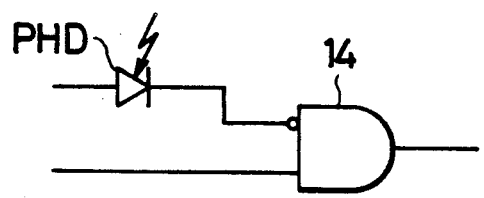
FIG. 5 shows a modified circuit in part of FIG. 4.
Figure 6:
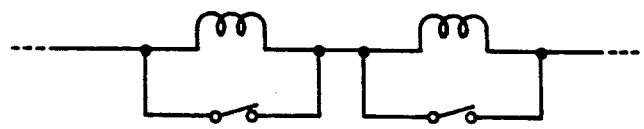
FIG. 6 is a schematic circuit diagram showing a typical prior art lamp circuit.

Alternatively, when the core 12 is provided on the short-circuiting line P$_2$, the circuit may be a negative input AND-circuit so that the output of the photodiode PHD becomes a negative input, as shown in FIG. 5.

INDUSTRIAL FEASIBILITY

First of all, the detecting device embodying the present invention is provided in each of the numerous serially connected lamp circuits so that the lamp operation can be remotely controlled and failure of any of the many lamps can be readily detected. The inventive device may be most suitably used to control the operation of for example guide lamps illuminating the runway of an airfield so as to contribute to safety in the take-off and landing of air planes.

Secondly, since according to the invention the power for the signal generators and the signals indicative of the lamp operation are likewise received by the current transformers, there is only remote possibility for the signal generators (and their associated power circuits) to sustain damage on account of surge which may occur in the lamp power line P$_1$.

In reality, power E shown in FIG. 2 is remotely supplied and the power line for lamps L$_1$-L$_n$ extends over a long distance. Therefore, surge is liable to occur by lightening strikes. However, according to the first embodiment of the invention hereinabove advanced, the power consumed by the core 12 is far less compared to that consumed by the filament 10, so that the effect of a surge on the power line P$_1$ is negligible.

Furthermore, since power E in FIG. 2 is generated as a current which is supplied to the filaments for lamps L$_1$-L$_n$ via transformers, these transformers in the event of lamp failure become unloaded and saturated, leading to the occurrence of spike-like surge voltage. However, the effect of this surge is negligible because the power consumption on the core 12 is considerably small as compared to the lamp filaments for the reasons above noted.

What is claimed is:

1. A lamp failure detecting device for use with each of a plurality of serially connected lamps, each device comprising; a core disposed on a lamp power line, a first winding extending from said power line and wound on said core, a second winding on said core for extracting power from said lamp power line through said core, an oscillator operating on the output voltage of said second winding and generating a predetermining frequency corresponding to a respective lamp, and a third winding on said core for superimposing an output signal having the predetermined frequency from said oscillator onto the power of said lamp power line.

2. A lamp failure detecting device according to claim 1, which further comprises a photodiode provided adjacent to each of the plurality of serially connected lamps and a respective AND-circuit for producing an output signal of a respective predetermined frequency on an AND condition of the output of said photodiode and the output signal of said oscillator.

3. A lamp failure detecting device for use with each of a plurality of connected lamps, each device comprising: transformer means operable in response to the existence of current flowing through a corresponding lamp for extracting power from a source through a power source line, the transformer means having a core, a first winding wound on the core and connected in series with and between the power source and the corresponding lamp so that the transformer means is operable only when power flows though the corresponding lamp, and a second winding wound on the core for receiving an induced power from the core; signal generating means for detecting the induced power and for producing a status signal respective to the corresponding lamp in response thereto; and signal supply means receptive of the status signal for supplying the status signal to the power source line.

4. A lamp failure detecting device for use with each of a plurality of connected lamps, each device comprising: transformer means operable in response to the existence of current flowing through a corresponding lamp for extracting power from a source through a power source line, the transformer means having a core, a first winding wound on the core and connected to the power source line, and a second winding wound on the core for receiving an induced power from the core; signal generating means for detecting the induced power and for producing a status signal respective to the corresponding lamp in response thereto, the signal generating means being an oscillator and the status signal being an oscillating electrical signal having a particular frequency respective to the corresponding lamp; and signal supply means receptive of the status signal for supplying the status signal to the power source line, the signal supply means including a third winding wound around the core for superimposing the status signal on the power source line via the core.

5. A lamp failure detecting device for use with each of a plurality of connected lamps, each device comprising: transformer means operable in response to the existence of current flowing through a corresponding lamp for extracting power from a source through a power source line, the transformer means having a core, a first winding wound on the core and connected in series with and between the power source and the corresponding lamp so that the transformer means is operable only when power flows through the corresponding lamp, and a second winding wound on the core for receiving an induced power from the core; signal generating means for detecting the induced power and for producing a status signal respective to the corresponding lamp in response thereto, the signal generating means being an oscillator and the status signal being an oscillating electrical signal having a particular frequency respective to the corresponding lamp; and signal supply means receptive of the status signal for supplying the status signal to the power source line.

6. A lamp failure detecting device according to claim 5; wherein said signal supply means includes a photodiode located adjacent to the corresponding lamp, and an AND-circuit connected to said photodiode and connected to said signal generating means for supplying the status signal only on an AND condition of the output from said signal generating means and the output from said photodiode.

7. A lamp failure detecting device according to claim 4; wherein said first winding is connected in series with and between the power source and the corresponding lamp so that said transformer means is operable only when power flows through the corresponding lamp.

8. A lamp failure detecting device according to claim 7; wherein said signal supply means includes a photodiode located adjacent to the corresponding lamp, and an AND-circuit connected to said photodiode and connected to said signal generating means for supplying the status signal only on an AND condition of the output from said signal generating means and the output from said photodiode.

9. A lamp failure detecting device according to claim 4; further comprising means for selecting the electrical frequency of the power extracted from said core by said second winding.

10. A lamp failure detecting device according to claim 9; wherein said first winding is connected in series with and between the power source and the corresponding lamp so that said transformer means is operable only when power flows through the corresponding lamp.

11. A lamp failure detecting device according to claim 10; wherein said signal supply means includes a photodiode located adjacent to the corresponding lamp and an AND-circuit connected to said photodiode and connected to said signal generating means for supplying the status signal only on an AND condition of the output from said signal generating means and the output from said photodiode.

12. A lamp failure detecting device according to claim 3; wherein said signal supply means includes a photodiode located adjacent to the corresponding lamp, and an AND-circuit connected to said photodiode and connected to said signal generating means for supplying the status signal only on an AND condition of the output from said signal generating means and the output from said photodiode.

* * * * *